United States Patent [19]

Narato et al.

[11] 4,436,699
[45] Mar. 13, 1984

[54] MONITORING SYSTEM FOR CHECKING ELECTRIC ROTARY MACHINE FOR LOCAL OVERHEATING

[75] Inventors: Kiyoshi Narato, Ibaraki; Keizou Ohtsuka, Hitachi; Tooru Inada, Hitachi; Takashi Watanabe, Hitachi, all of Japan

[73] Assignee: Hitachi, Ltd., Tokyo, Japan

[21] Appl. No.: 271,356

[22] Filed: Jun. 8, 1981

[30] Foreign Application Priority Data

Sep. 6, 1980 [JP] Japan .................... 55-122946

[51] Int. Cl.³ ............... G01N 15/00; G01N 27/00; G01N 33/44
[52] U.S. Cl. ........................... 422/68; 73/28; 340/647; 340/679; 374/57; 374/152; 422/98; 436/7
[58] Field of Search ............... 422/68, 93, 98; 436/7, 436/36; 73/1 G, 28; 340/647, 679; 374/57, 152

[56] References Cited

U.S. PATENT DOCUMENTS

| | | | |
|---|---|---|---|
| 3,427,880 | 2/1969 | Grobel et al. | 436/7 |
| 3,674,435 | 7/1972 | Van Luik et al. | 73/1 G |
| 3,702,561 | 11/1972 | Carson et al. | |
| 3,807,218 | 4/1974 | Carson et al. | 73/28 |
| 3,849,070 | 11/1974 | Garza et al. | 422/68 |
| 4,046,512 | 9/1977 | Kaczmarek et al. | 436/7 |
| 4,135,399 | 1/1979 | Kaczmarek et al. | 436/7 |
| 4,149,161 | 4/1979 | Phillips et al | 436/7 |
| 4,328,700 | 5/1982 | Fries | 73/1 G |
| 4,364,032 | 12/1982 | Narato et al. | 436/7 |

Primary Examiner—Bradley Garris
Attorney, Agent, or Firm—Antonelli, Terry & Wands

[57] ABSTRACT

A monitoring system for checking an electric rotary machine for local overheating including a sensing device for sensing the concentration of minuscule particles in a gas serving as coolant for the machine, and a supply device for supplying to the sensing device a test gas containing minuscule particles of gasifiable liquid. The test gas is supplied to the sensing device by the supply device to permit the sensing device to perform a sensing operation, so as to determine whether or not the sensing device is functioning normally.

2 Claims, 1 Drawing Figure

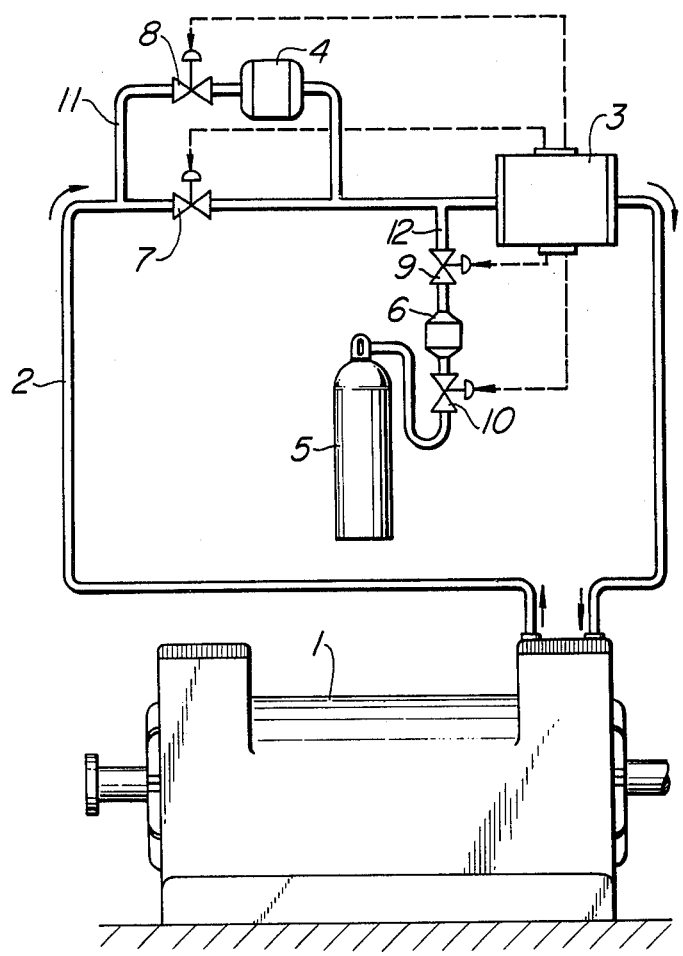

MONITORING SYSTEM FOR CHECKING ELECTRIC ROTARY MACHINE FOR LOCAL OVERHEATING

BACKGROUND OF THE INVENTION

This invention relates to monitoring systems for checking electric rotary machines for local overheating, and, more particularly, to a monitoring system for checking a gas cooled electric rotary machine for local overheating of parts such as a stator core covered with organic insulating material which tends to suffer from thermal deterioration.

When the stator core of a gas-cooled generator of a large size develops local overheating, the iron core suffers damage and mechanical failure thereby making it necessary to effect highly expensive repairs. One of the factors concerned in the development of local overheating in this type of electric rotary machine is damage to the surface of the stator which might cause electric contact to be established between layers of the laminated iron core. When this happens while a load is being applied to the machine, a current would flow and heat of resistance would be generated in the iron core. This local overheating would cause a generation of heat of an amount sufficient to melt the laminated iron core. Thus the need to provide the machine with a system for an early detection or sensing of local overheating has been keenly felt, so that a load applied to the machine can be reduced and serious damage can be avoided by taking necessary steps to prevent the overheating from spreading to other parts of the machine.

Generally, an iron core and coil of a generator are covered with organic insulating material, such as phenol resin and, in the event that local overheating develops, the organic insulating material would be exposed to high temperature and undergo pyrolysis that would cause minuscule particles of less than $1\mu$ to be produced and dispersed in the coolant or gas. In, for example, Japanese Patent Application Laid-Open Number 64703/75 a device for sensing minuscule particles in a coolant gas is proposed wherein an ionizing section producing corona discharge, and a detecting section forming a weak electric field for collecting ionized particles are provided. With this proposed device it is possible to detect the presence or absence of minuscule particles in the gas by ionizing and causing the ionized particles to be trapped by an electrode so that a current produced by the released charge can be measured. The value of the current obtained in this manner would correspond to the concentration of the minuscule particles in the gas. Thus, by using this detecting device for monitoring the concentration of minuscule particles in the gas serving as coolant at all times, it would be possible to indirectly check the generator for possible local overheating of parts covered with organic insulating material.

When the detecting device of this type is used with an electric rotary machine for monitoring the concentration of minuscule particles and the device malfunctions and generates a wrong signal, the electric rotary machine would be shut down without any valid reason, thereby causing a reduction in the rate of operation of the machine.

To avoid this disadvantage, proposals have been made to use a monitoring system for checking an electric rotary machine for local overheating, which proposals include providing a filter device mounted in a cooling gas extracting passage between the electric rotary machine and the detecting device for filtering the cooling gas to remove minuscule particles therefrom, and a testing device located upstream of the filter device and including a filament covered with organic material.

This monitoring system operates such that the cooling gas extracted from the electric rotary machine is supplied to the detecting device to determine whether or not local overheating is present, and, when the presence of overheating is detected, the flow of cooling gas is switched to the filter device to remove the minuscule particles therefrom. The flow of cooling gas is then introduced into the detecting device and the determination of the presence of overheating is acknowledged as being valid if the value obtained by detecting is found to be at normal background level. When the value determined after filtering the gas fails to return to the normal background level, the condition can be attributed to either a malfunction of the detecting device or malfunction of the filter device.

In order to check the filter device for its performance, a current is passed to the filament of the testing device for a predetermined time to cause the organic material covering the filament to undergo pyrolysis, and the minuscule particles produced by the pyrolysis of the organic material are added to the gas serving as coolant. In this fashion, a test gas similar to the gas containing minuscule particles and causing local overheating in an electric rotary machine is prepared, and tests are conducted by using this test gas. That is, the test gas is directly fed into the detecting device without passing through the filter device, and also supplied to the detecting device by way of the filter device. The values obtained by measuring the minuscule particles in the two gases are compared with each other to check the filter device for its performance.

In this type of local overheating monitoring system, solid minuscule particles are produced by pyrolysis of the testing device during operation and fed together with the coolant gas after clearing the detecting device. Thus, the concentration of the minuscule particles in the machine gradually rises as the testing device is actuated. During normal operation of the electric rotary machine, production of minuscule particles in abnormally large quantities due to pyrolysis stemming from local overheating can be better detected when the concentration of minuscule particles in the machine is low. However, in the event that minuscule particles for which no local overheating is responsible are fed into the machine as aforesaid, then the background level of the concentration of minuscule particles in the coolant gas gradually rises, so that the values obtained by the detecting device are unrealiable.

Also, the testing device has a low reliability, because the contact strength between the organic material and the filament may be reduced when due to the moisture content of the gas, dew is formed on the surface of the filament and, due to vibration, the organic material may be dislodged.

SUMMARY OF THE INVENTION

This invention has been developed for the purpose of obviating the aforesaid disadvantages of the prior art. Accordingly, an object of the present invention resides in providing a monitoring system for checking an electric rotary machine for local overheating, which system is capable of accurately sensing local overheating with a high reliability.

The aforesaid object is accomplished according to the invention by providing, in a monitoring system for an gas-cooled electric rotary machine which includes parts covered with organic insulating material tending to undergo pyrolysis when exposed to elevated temperature, a sensing device for sensing the concentration of minuscule particles in a coolant gas, with the system being operative to determine that a local overheating is present when the concentration of the minuscule particles, as measured by the sensing device, exceeds a predetermined value. A test gas supply means is connected to the sensing device for introducing a test gas containing gasifiable minuscule particles, such as liquefied carbon dioxide into the sensing device thereby enabling a test of the sensing device to determine if it is functioning normally.

BRIEF DESCRIPTION OF THE DRAWING

The single drawing is a schematic view of the monitoring system for checking an electric rotary machine for local overheating comprising one embodiment of the invention.

DESCRIPTION OF THE PREFERRED EMBODIMENT

As shown in the single FIGURE of the drawing, a gas-cooled turbine-generator 1 mainly comprises a stator, a rotor and an air tight sealed casing containing the stator and rotor, with a space conaining the stator and rotor being filled with a gas, such as hydrogen serving as coolant. The gas is circulated through the casing by a fan mounted on the stator to cool the stator and other parts and returned to the suction side of the fan after being cooled by a cooler.

A gas extracting line 2 is connected to the generator 1 and is adapted to extract a portion of the gas in the high low pressure ranges. A bypass line 11, an electromagnetic valve 7, a conduit 12 and a sensing device 3 for sensing the concentration of minuscule particles in the gas are respectively arranged in the gas extracting line 2 from the upstream side toward the downstream side of the line 2, as viewed in the direction of flow of the extracted gas. The bypass line 11 has disposed therein an electromagnetic valve 8, and a filter device 4 for filtering the gas to remove minuscule particles therefrom thereby providing a gas free from foreign matter. An electromagnetic valve 9, a volume measuring tube 6, an electromagnetic valve 10 and a container or cylinder 5 for containing liquefied carbon dioxide are arranged in the conduit 12 between the point of connection of the conduit 12 with the gas extracting line 2 to the end of the conduit 12. The container 5 containing liquefied carbon dioxide under a chargine pressure of about 60 $Kg/cm^2G$.

Prior to an initiation of operation of a monitoring of an electtric rotary machine for sensing local overheating, the electromagnetic valve 7 is opened and the electromagnetic valves 8, 9 and 10 are closed. Thus, a portion of the coolant gas circulating through the generator 1 is directly fed into the sensing device 3 through the gas extracting line 2 and returned to the generator 1 after having the concentration of minuscule particles therein measured. The sensing device 3 produces an output signal which is supplied to a memoy and arithmetic unit, not shown, which stores data on the concentrations of minuscule particles measured during normal operation of the generator 1 when it is free from local overheating. The output signal supplied from the sensing device 3 to the memory and arithmetic unit from time to time is compared with the stored data and a calculation is effected so that this process is followed while the generator 1 continues to operate normally to monitor the concentration of minuscule particles.

Once local overheating develops in the generator 1, the concentration of the minuscule particles in the gas serving as coolant rises. Upon the value of the concentration obtained by the sensing device 3 exceeding a predetermined level, the memory and arithmetic unit produces an abnormality indicating signal which closes the electromagnetic valve 7 and opens the electromagnetic valve 8. This feeds the extracted gas into the bypass line 11, and the gas is filtered by the filter device 4 to have the minuscule particles removed therefrom to provide a gas free from minuscule particles which is led to the sensing device 3. Since the gas filtered by the filter device 4 contains no minuscule particles, the value of the sensed concentration is zero and indicates that the detecting device 3 is functioning normally.

Following lapse of a predetermined time, the electtromagnetic valve 10 is opened and the volume measuring tube 6 of a capacity of 1 ml is filled with liquefied carbon dioxide from the container 5. Thereafter the electromagnetic valve 10 is closed and the electromagnetic valve 9 is opened. This causes a predetermined volume of liquefied carbon dioxide, ejected in atomized particles into the gas extracting line 2 through a nozzle, not shown, mounted at the forward end of the conduit 12, to be incorporated in the stream of filtered gas in the gas extracting line 2 and supplied to the sensing device 3. When the value of the atomized particles is at a predetermined level, the sensing device 3 is found to be functioning normally and the abnormality indicating signal produced by the memory and calculating unit is attributed to overheating. The sensing device 3 can be tested in this fashion by using a test gas for malfunctioning.

The atomized particles of liquefied carbon dioxide are gasified while they flow through the sensing device 3 and returned to the generator 1 via the gas extracting line 2, so that there is no risk of liquefied carbon dioxide being circulated through the generator 1 in the form of fine atomized particles.

The liquefied carbon dioxide required for producing a test gas is about 1 ml. Thus, the use of a container 5 of a capacity of 100 ml enables about 100 test runs to be carried out without refilling the container 5. When hydrogen gas is sealed into the generator 1, carbon dioxide gas is used as a substitution gas for replacing the air in the generator 1, and about 1% carbon dioxide gas, by volume is contained in the hydrogen having a purity of about 98%, by volume. Also, since the liquefied carbon dioxide required for producing a test gas is, as noted above, about 1 ml or 5 ml at most, it is very small in volume as compared with the coolant gas in the generator 1, so there is no risk of the reduction of purity of the coolant gas or other troubles occurring.

From the foregoing description, it will be appreciated that in the monitoring system according to the invention a test gas containing gasifiable minuscule particles is used for checking the sensing device as to whether or not it is functioning normally. Since the minuscule particles used in the test are gasified after the test, the concentration of the coolant gas is not affected by the test, and checking of the generator 1 to see if it is free from local overheating can be carried out with accurate results.

What is claimed is:

1. A monitoring system for checking for local overheating of an electric rotary machine of the gas-cooled type, with the machine including parts covered with organic insulating material tending to undergo pyrolysis when exposed to elevated temperatures, the system comprising:

a sensing means for sensing a concentration of minuscule particles in a coolant gas for the electric rotary machine, the electric rotary machine being determined as having a local overheating when a predetermined level is exceeded by the concentration of the minuscule particles as sensed by said sensing means;

test gas supply means for supplying liquified carbon dioxide connected to said sensing means, said test gas supply means being operative to feed the liquified carbon dioxide into said sensing means thereby causing the sensing means to perform a sensing operation, to thereby determine whether or not the sensing means is functioning normally;

a passage means for feeding coolant gas from the electric rotary machine into said sensing means, said passage means comprising a first passage for directly feeding the coolant gas from the electric rotary machine into the sensing means, and a second passage for feeding the coolant gas from the electric rotary machine into the sensing means through a filter means for removing minuscule particles from the coolant gas to provide the sensing means with a gas free from minuscule particles;

a liquid atomizing device communicating with said second passage at a position downstream of said filter means for injecting the liquified carbon dioxide as atomized particles into the gas free from the minuscule particles; and switch means for switching a direction of flow of the coolant gas between the first passage and the second passage, said switch means being adapted to allow the coolant gas to flow through the first passage when the coolant gas flowing through the electric rotary machine is sensed by the sensing means to determine a concentration thereof, and to allow the coolant gas to flow through the second passage when the gas free from the minuscule particles is provided by the filter means and the liquified carbon dioxide is injected as atomized particles by the liquid atomizing device into the filtered gas to provide a test gas so that the test gas is fed into the sensing means to determine whether or not the sensing means is functioning normally.

2. A monitoring system as claimed in claim 1, wherein said liquid atomizing device comprises a means for accommodating a charge of liquified carbon dioxide, a volume measuring tube means connected to said means for accommodating through a valve for containing a predetermined volume of the liquified carbon dioxide supplied from the means for accommodating, and an injecting tube means communicating with the volume measuring tube means through a valve for injecting the charge of the liquified carbon dioxide in said volume measuring tube means as atomized particles into the filtered gas.

* * * * *